(12) United States Patent
Zhang et al.

(10) Patent No.: US 11,682,412 B2
(45) Date of Patent: Jun. 20, 2023

(54) INFORMATION PROCESSING METHOD, ELECTRONIC EQUIPMENT, AND STORAGE MEDIUM

(71) Applicants: BEIJING XIAOMI MOBILE SOFTWARE CO., LTD., Beijing (CN); Beijing Xiaomi Pinecone Electronics Co., Ltd., Beijing (CN)

(72) Inventors: Rui Zhang, Beijing (CN); Zhao Wang, Beijing (CN); Lianjie Tao, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/517,578

(22) Filed: Nov. 2, 2021

(65) Prior Publication Data

US 2022/0343931 A1 Oct. 27, 2022

(30) Foreign Application Priority Data

Apr. 26, 2021 (CN) .......................... 202110455789.X (51) Int. Cl.
| | | |
|---|---|---|
| *G10L 21/0232* | (2013.01) | |
| *G10L 25/21* | (2013.01) | |
| *H04R 1/40* | (2006.01) | |
| *H04R 3/12* | (2006.01) | |
| *G10L 21/0208* | (2013.01) | |

(52) U.S. Cl.
CPC .......... *G10L 21/0232* (2013.01); *G10L 25/21* (2013.01); *H04R 1/403* (2013.01); *H04R 3/12* (2013.01); *G10L 2021/02082* (2013.01)

(58) Field of Classification Search
None
See application file for complete search history.

(56) References Cited

U.S. PATENT DOCUMENTS

| | | | | |
|---|---|---|---|---|
| 9,444,422 | B2 * | 9/2016 | Bharj | H03G 1/02 |
| 9,596,429 | B2 * | 3/2017 | Garcia Navarro | H04N 7/15 |
| 9,799,210 | B2 * | 10/2017 | Kohlrausch | H03G 3/32 |
| 9,936,325 | B2 * | 4/2018 | Smith | H04R 29/00 |
| 9,961,294 | B2 * | 5/2018 | Yoo | H04N 21/4524 |
| 10,026,416 | B2 * | 7/2018 | Takasu | H03G 3/002 |
| 10,147,439 | B1 * | 12/2018 | Kristjansson | G10L 21/034 |
| 10,705,791 | B2 * | 7/2020 | Yang | G10L 25/84 |
| 11,276,384 | B2 * | 3/2022 | Woodruff | H04R 1/1008 |

(Continued)

FOREIGN PATENT DOCUMENTS

| | | |
|---|---|---|
| CN | 111427535 A | 7/2020 |
| WO | 2019209973 A1 | 10/2019 |

*Primary Examiner* — Paul W Huber
(74) *Attorney, Agent, or Firm* — Arch & Lake LLP (57) ABSTRACT

Methods, apparatuses, and non-transitory computer-readable storage mediums are provided for information processing. The method may be applied to an electronic equipment. The electronic equipment may collect environmental audio information when the electronic equipment plays multimedia. The electronic equipment may also perform noise detection on the environmental audio information to determine whether the environmental audio information represents a target noise scenario. The electronic equipment may also process a parameter of the multimedia played by the electronic equipment when the environmental audio information represents the target noise scenario.

15 Claims, 5 Drawing Sheets

(56) References Cited

U.S. PATENT DOCUMENTS

| | | | |
|---|---|---|---|
| 11,288,036 B2 * | 3/2022 | Kuivalainen | H03G 3/3005 |
| 2010/0166225 A1 | 7/2010 | Watanabe et al. | |
| 2013/0218560 A1 | 8/2013 | Hsiao et al. | |
| 2020/0213729 A1 | 7/2020 | Soto | |
| 2022/0028405 A1 * | 1/2022 | Hines | G10L 21/0232 |
| 2022/0035593 A1 * | 2/2022 | Lee | G10L 21/0316 |
| 2022/0199066 A1 * | 6/2022 | Trivedi | H03G 3/32 |

* cited by examiner

INFORMATION PROCESSING METHOD, ELECTRONIC EQUIPMENT, AND STORAGE MEDIUM

CROSS-REFERENCE TO RELATED APPLICATION

The disclosure claims the priority to Chinese Patent Application No 202110455789.X filed on Apr. 26, 2021, which is incorporated herein by reference in its entirety.

TECHNICAL FIELD

The present disclosure relates to the field of electronics, and in particular, to a method and device for information processing.

BACKGROUND

Electronic equipment automatically adjusts audio and video information parameters according to the noise of external environment when playing audio and video information. How to automatically adjust the audio and video information parameters of the electronic equipment based on the noise of the external environment has become a technical shortcoming that needs improvement.

SUMMARY

The disclosure relates to the technical field of electronics, in particular to an information processing method, an electronic equipment, and a storage medium.

Examples of the present disclosure provides an information processing method, an electronic equipment, and a storage medium.

According to a first aspect of the embodiments of the disclosure, a method for information processing is provided. The method may be applied to electronic equipment. The electronic equipment may collect environmental audio information when the electronic equipment plays multimedia. The electronic equipment may also perform noise detection on the environmental audio information to determine whether the environmental audio information represents a target noise scenario. The electronic equipment may further process a parameter of the multimedia played by the electronic equipment when the environmental audio information represents the target noise scenario.

According to a second aspect of the embodiments of the disclosure, an electronic equipment is provided. The electronic equipment may include one or more processors, a non-transitory computer-readable memory storing instructions executable by the one or more processors. The one or more processors may be configured to collect environmental audio information when the electronic equipment plays multimedia. The one or more processors may also be configured to perform noise detection on the environmental audio information to determine whether the environmental audio information represents a target noise scenario. The one or more processors may also be configured to process a parameter of the multimedia played by the electronic equipment when the environmental audio information represents the target noise scenario.

According to a third aspect of the embodiments of the disclosure, a non-transitory computer-readable storage medium having stored therein instructions is provided, when instructions stored in the storage medium are executed by one or more processors of an electronic equipment, the electronic equipment may cause the electronic equipment to collect environmental audio information when the electronic equipment plays multimedia. The instructions may also cause the electronic equipment to perform noise detection on the environmental audio information to determine whether the environmental audio information represents a target noise scenario. The instructions may also cause the electronic equipment to process a parameter of the multimedia played by the electronic equipment when the environmental audio information represents the target noise scenario.

It should be understood that the above general description and the following detailed description cannot limit the disclosure.

BRIEF DESCRIPTION OF THE DRAWINGS

The accompanying drawings herein are incorporated into the specification and constitute a part of the specification, show embodiments consistent with the disclosure, and are used to explain the principle of the disclosure together with the specification.

DETAILED DESCRIPTION

Some embodiments will be described in detail here, and examples thereof are shown in the accompanying drawings. When the following descriptions refer to the drawings, the same numbers in different drawings indicate the same or similar elements, unless otherwise indicated. The implementation manners described in some embodiments below do not represent all implementation manners consistent with the disclosure. Instead, they are merely examples of apparatuses and methods consistent with some aspects of the disclosure as detailed in the appended claims.

The present disclosure optimizes an improvement for automatically adjusting audio and video information parameters based on environmental noise, and aims to realize an improvement for automatically adjusting audio and video information parameters with higher accuracy. Based on this, in order to achieve the improvement for automatically adjusting audio and video information parameters with higher accuracy, the disclosure provides an information processing method.

It was found in research that in related technologies, electronic equipment automatically adjusts audio and video information parameters according to the noise of external environment when playing audio and video information, but this adjustment manner is often turn-up adjustment on playback volume when the noise volume of external environment is greater than a preset volume. Obviously, this manner is too general and there are many misjudgment scenarios. For example, when the noise of the external environment is a phone call or a ring tone, the playback volume of the electronic equipment often does not need to be adjusted. Based on this, how to automatically adjust the audio and video information parameters of the electronic equipment based on the noise of the external environment has become a technical shortcoming that needs improvement.

This method is applied to an electronic equipment, and the electronic equipment may be a mobile terminal, a desktop computer, a smart home device etc. Among them, the mobile terminal may be a mobile phone, a tablet computer, or a notebook computer; and the smart home device may be a smart television or a smart speaker, etc. It is understandable that the method may be applied to any electronic equipment with an audio module, such as an electronic equipment with a microphone and a speaker.

Figure 1:
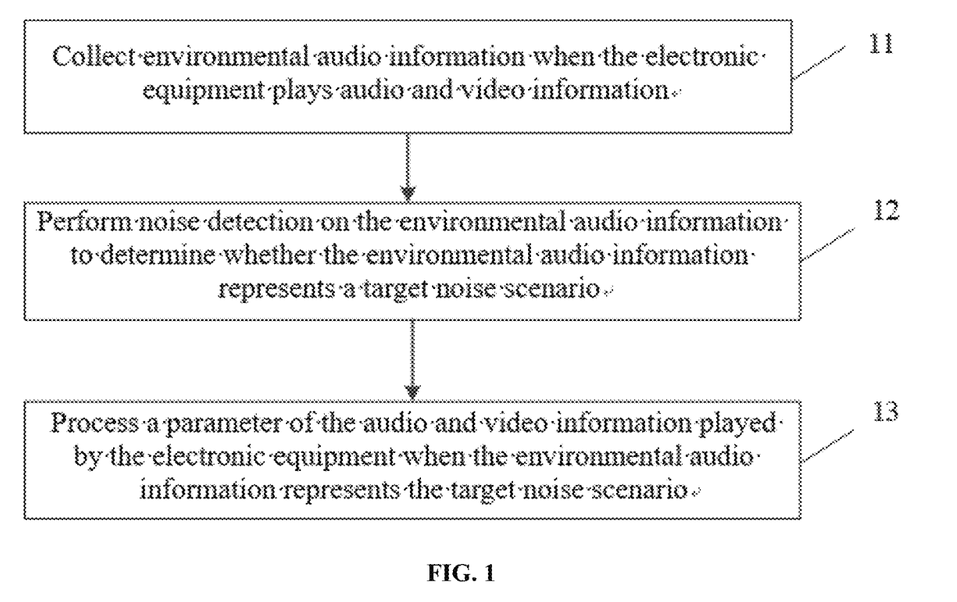
FIG. 1 is a flowchart of an information processing method according to an example of the present disclosure.

FIG. 1 is a flowchart of an information processing method according to some embodiments. As shown in FIG. 1, the method may include the following steps:

Step 11: environmental audio information is collected when the electronic equipment plays multimedia, which may include audio information, video information, or a combination of audio and video information; and Step 12: noise detection is performed on the environmental audio information to determine whether the environmental audio information represents a target noise scenario;

Step 13: a parameter of the audio and video information played by the electronic equipment is processed when the environmental audio information represents the target noise scenario.

The environmental audio information here refers to all audio information existing in an environment. For example, the environmental audio information may include, but is not limited to: audio information sent by the electronic equipment itself, audio information sent by other sound sources other than the electronic equipment, audio information reflected by a target object, etc. The target object is a wall or the like.

The target noise scenario here refers to a preset related scenario that requires audio and video information parameter adjustment. For example, a home noise scenario of a home device such as a hair dryer may be the target noise scenario described in this embodiment. Of course, in other embodiments, the user may also set other noise scenario as the target noise scenario, such as traffic noise on outdoor roads.

Here, the parameter of the audio and video information played by the electronic equipment may be a volume of the audio and video information played by the electronic equipment. In some embodiments, the step of processing a parameter of the audio and video information played by the electronic equipment may include:

The volume of the audio and video information played by the electronic equipment is turned up.

In some embodiments, the step of turning up the volume of the audio and video information played by the electronic equipment may further include:

The volume of the audio and video information played by the electronic equipment is turned up according to a preset first adjustment amount, for example, the volume is turned up by five levels. As such, when the environmental audio information represents the target noise scenario, the volume is turned up according to the fixed preset first adjustment amount, so that the audio and video information played by the electronic equipment in the target noise scenario can be more clearly recognized by the user, and the electronic equipment does not need to calculate a volume adjustment amount, which reduces computing resources of the electronic equipment.

In order to ensure that the audio and video information played by the electronic equipment in the target noise scenario can be recognized by the user, in other embodiments, the step of turning up the volume of the audio and video information played by the electronic equipment may further include:

A second adjustment amount is determined according to the volume in the environmental audio information; and The volume of the audio and video information played by the electronic equipment is turned up according to the second adjustment amount.

It can be understood that the volume of the environmental audio information is directly proportional to the second adjustment amount. As such, when the volume of the environmental audio information is turned up, the adjustment amount is also increased, so as to ensure that the audio and video information played by the electronic equipment in the target noise scenario can be recognized by the user.

Of course, the parameter of the audio and video information played by the electronic equipment may also be a playback speed of the audio and video information played by the electronic equipment. In some embodiments, the step of processing a parameter of the audio and video information played by the electronic equipment may include:

The playback speed of the audio and video information played by the electronic equipment is decreased.

As such, when the environmental audio information represents the target noise scenario, the playback speed of the audio and video information played by the electronic equipment is decreased, so that the electronic equipment can slow down the playback in the target noise scenario to reduce the playback amount of audio and video information disturbed by noise in the target noise scenario that the user is watching or listening.

In one or more embodiments, the parameter of the audio and video information played by the electronic equipment is processed only when the environmental audio information represents the target noise scenario. Compared with related technologies of automatically adjusting a volume only by a noise volume of an external environment, the embodiment of the disclosure can collect environmental audio information when the electronic equipment plays audio and video information, perform noise detection on the collected audio information to determine whether the environmental audio information represents a target noise scenario, and process a parameter of the audio and video information played by the electronic equipment only when the environmental noise information represents the target noise scenario, so that the judgment of the electronic equipment on external environmental noise is no longer just a judgment on the volume, but the parameter of the audio and video information played by the electronic equipment is processed only when it is determined that the collected environmental audio information represents the target noise scenario, which improves the accuracy of automatically adjusting the volume by the electronic equipment in response to the noise of the external environment, reduces the mis-adjustment of audio and video information parameters that are not in the target noise scenario, and enables the improvement of automatically adjusting the volume of the electronic equipment based on the environmental noise to be more accurate.

Figure 2:
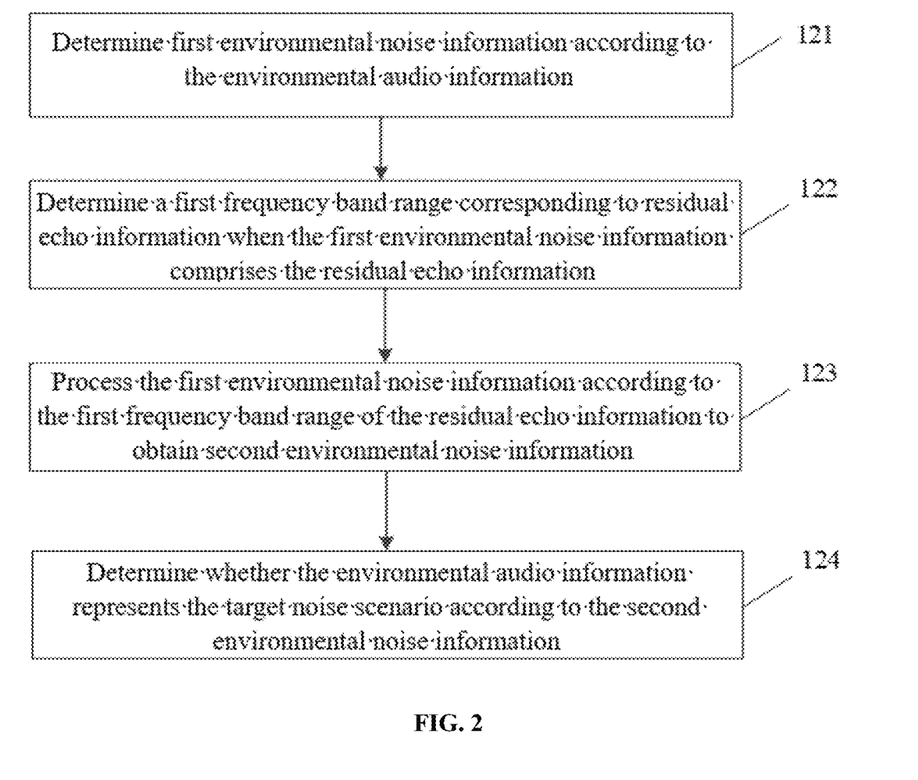
FIG. 2 is another flowchart of an information processing method according to an example of the present disclosure.

In other embodiments, in order to improve the accuracy of determining whether the environmental audio information represents the target noise scenario, FIG. 2 is another flowchart of an information processing method according to some embodiments, as shown in FIG. 2, step 12 of performing noise detection on the environmental audio information to determine whether the environmental audio information represents a target noise scenario may include:

Step 121: first environmental noise information is determined according to the environmental audio information;

Step 122: a first frequency band range corresponding to residual echo information is determined when the first environmental noise information includes the residual echo information;

Step 123: the first environmental noise information is processed according to the first frequency band range of the residual echo information to obtain second environmental noise information;

Step 124: whether the environmental audio information represents the target noise scenario is determined according to the second environmental noise information.

It is understandable that when the electronic equipment has a plurality of speakers, sounds produced by the speakers affect each other, so that the electronic equipment cannot accurately obtain echo information generated in the environment, and a part of the echo information is retained to generate the residual echo information. The residual echo information here refers to the part of the echo information that has not been cancelled after the environmental audio information is processed by echo cancellation.

In some embodiments, the electronic equipment includes a plurality speakers; and step 121 of determining first environmental noise information according to the environmental audio information may include:

Echo cancellation is performed on the environmental audio information according to the environmental audio information collected by the plurality of speakers to determine the first environmental noise information.

Here, the environmental audio information may be collected by a microphone.

For example, the step of performing echo cancellation on the environmental audio information according to the environmental audio information collected by the plurality of speakers to determine the first environmental noise information may include:

Echo cancellation is directly performed on the environmental audio information collected by the plurality of speakers to determine the first environmental noise information.

For example, the step of directly performing echo cancellation on the environmental audio information collected by the plurality of speakers to determine the first environmental noise information includes:

The same Fourier transform function is multiplexed when echo cancellation is performed on the environmental audio information collected by the plurality of speakers and speaker information to calculate the first environmental noise information.

Here, the speaker information refers to parameters of the speakers, such as factory parameters of the speakers.

Compared with the existing technologies in which Fourier transform is first performed on the environmental audio information collected by the plurality of speakers, and then performed on the data obtained after inverse Fourier transform and the speaker information used during echo cancellation to calculate the first environmental noise information, the same Fourier transform function is multiplexed when echo cancellation is performed on the environmental audio information collected by the plurality of speakers and the speaker information to calculate the first environmental noise information in this embodiment, which can reduce the calculation amount of multiple Fourier transforms and inverse transforms on the environmental audio information collected by the plurality of speakers, and reduce inaccurate echo cancellation caused by data missing during multiple Fourier transforms and inverse transforms on the environmental audio information collected by the plurality of speakers.

Here, before echo cancellation is performed on the environmental audio information collected by the plurality of speakers and the speaker information, the method further includes: the environmental audio information and the speaker information are pre-processed.

The step of pre-processing the environmental audio information and the speaker information may include: the environmental audio information and the speaker information are framed and windowed.

For example, the environmental audio information is s(n), and the speaker information is y(n). Taking the sampling rate of 16000 as an example, the s(n) and the y(n) are framed and windowed. The window function is w(n), and the frame length is moved from 16 ms to 8 ms. The window function may be any of a common Hanning window or Hamming window. s(n,m) and y(n,m) are obtained after the framing and windowing, where m represents an index of the number of frames. The framing and windowing specifically may refer to expressions (1) and (2):

$$s(n,m)=s((m-1)*\text{inc}+n)*w(n), 1\leq n\leq L \quad (1)$$

$$y(n,m)=y((m-1)*\text{inc}+n)*w(n), 1\leq n\leq L \quad (2)$$

Where, m represents an index of the number of frames, L represents a frame length taking 256 as an example, inc represents a frame shift taking 128 as an example, s(n,m) and y(n,m) are the input of echo cancellation, and the output is the first environmental noise information with the echo information removed, such as spectrum information S(k,m) of environmental audio, where k represents an index of the spectrum information after Fourier transform.

Ideally, S(k,m) does not include any microphone echo information, but in practical applications, more echo information is retained under multi-channel playback devices in existing algorithms.

In order to reduce the interference of residual echo information, in step 122 of the embodiment of the disclosure, the first frequency band range corresponding to the residual echo information is determined when the first environmental noise information includes the residual echo information.

Here, the first frequency band range of the residual echo information may be preset in the electronic equipment. For example, step 122 of determining a first frequency band range corresponding to the residual echo information may include: the first frequency band range of the residual echo information preset in the electronic equipment is read. It is understandable that the first frequency band range of the residual echo information may be detected by an external instrument or by experiments. Here, through the experimental detection, for example, in the same noise environment provided, the noise information detected in a playback scenario and an unplayed scenario may be compared to determine a frequency band range of echo information, and the frequency band range of the echo information is regarded as the first frequency band range of the residual echo information. In other embodiments, the first frequency band range of the residual echo information may also be read from a cloud server.

For example, the first frequency band range of the residual echo information may be less than or equal to 1200 Hz.

It is understandable that since the first environmental noise information includes residual echo information, that is, the first environmental noise information cannot represent real environmental noise information, and the residual echo information is not canceled in related technologies, using the first environmental noise information as real environmental noise information obviously makes the judgment result inaccurate. At step 123 here, the first environmental noise information is processed according to the first frequency band range of the residual echo information to obtain second environmental noise information. For example, the step of processing the first environmental noise information according to the first frequency band range of the residual echo information to obtain second environmental noise information may include: the first environmental noise information in frequency bands beyond the first frequency band range is selected and removed from the first environmental noise information to obtain the second environmental noise information. As such, using the second environmental noise information as the real environmental noise information can improve the accuracy of judging whether the environmental noise information is target noise information, and since the first frequency band range is removed during calculation, the amount of calculation can also be reduced.

Figure 3:
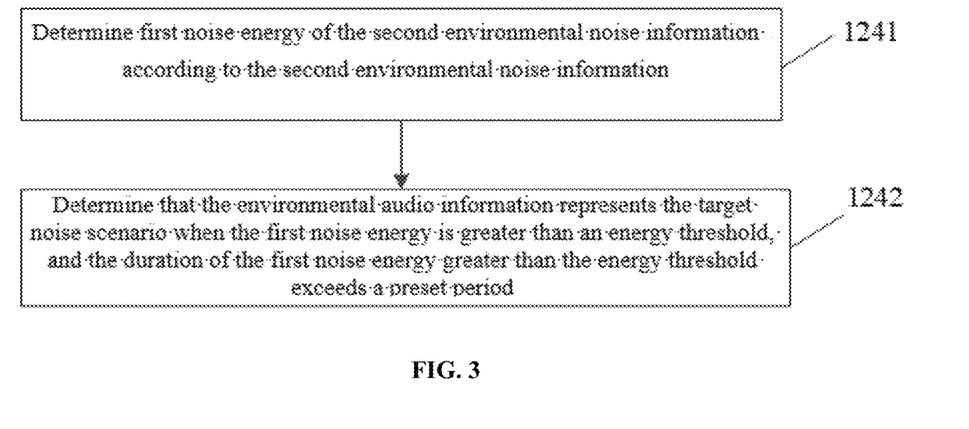
FIG. 3 is still another flowchart of an information processing method according to an example of the present disclosure.

In other embodiments, referring to FIG. 3, the step of determining, according to the second environmental noise information, whether the environmental audio information represents the target noise scenario may include:

Step 1241: first noise energy of the second environmental noise information is determined according to the second environmental noise information; and Step 1242: it is determined that the environmental audio information represents the target noise scenario when the first noise energy is greater than an energy threshold, and the duration of the first noise energy greater than the energy threshold exceeds a preset period.

Here, the first noise energy may be energy of the second noise information in the preset period. For example, the first noise energy may be sliding energy of the second noise information in the preset period.

The energy threshold here may be the lowest energy of the real environmental noise in the preset period in the noise scenario corresponding to the target noise information.

It should be supplemented that, in some embodiments, the preset period may include a plurality of frame durations, which may be integrated into a plurality of segment data, and one segment data may include a plurality of frames.

When the first noise energy is calculated, noise energy of each frame of the second environmental noise is first calculated. For example, the noise energy Se(m) of each frame is calculated by expression (3):

$$Se(m) = \frac{1}{N} * \sum_{k=r}^{N-r} S(k, m) \quad (3)$$

m represents an index of the number of frames, and N represents a length of Fourier transform, generally N=L; r represents the lowest frequency point when a frame of the second environmental noise is calculated. Here, taking the frequency band range of the residual echo information less than 1200 Hz as an example, r may be 20. In this embodiment, dividing by N when the noise energy of each frame is calculated can prevent the shortcoming of numeric overflow when the noise energy is calculated.

For example, taking 4 frames of data as 1 segment data, the energy of the 1 segment data calculated is a composite of energy of the 4 frames of data. The composite of energy of the 4 frames of data is calculated by expression (4):

$$Seblock(a) = \sum_{i=1}^{4} Se(4a + i) \quad (4)$$

Where, a is an index of the segment data.

For example, 10 segment data is used, and a composite of energy of the 10 segment data is calculated by expression (5):

$$Seblock10(a) = \frac{1}{10} * \sum_{i=a-9}^{a} Seblock(i), a \geq 10 \quad (5)$$

As such, a plurality of segment data is calculated as a first noise energy. Compared with related technologies in which the audio parameter is adjusted as long as the noise energy is greater than the energy threshold, this embodiment determines that the environmental audio information represents the target noise scenario when the first noise energy is greater than the energy threshold and the duration of the first noise energy greater than the energy threshold exceeds the preset period, so that the accuracy of adjusting the audio parameter based on the target noise scenario is higher, and the mis-adjustment in transient non-target noise scenarios is reduced.

In order to further improve the accuracy of determining the target environmental noise information, as another optional embodiment, the preset period includes: a first preset sub-period and a second preset sub-period that have the same duration and are adjacent to each other;

The step of determining that the environmental audio information represents the target noise scenario when the first noise energy is greater than an energy threshold, and the duration of the first noise energy greater than the energy threshold exceeds a preset period includes:

A correlation between the second environmental noise information of the first preset sub-period and the second environmental noise information of the second preset sub-period is determined when the first noise energy is greater than the energy threshold, and the duration of the first noise energy greater than the energy threshold exceeds the preset period; and It is determined that the environmental audio information represents the target noise scenario when the correlation is greater than or equal to a correlation threshold.

It should be noted that the preset period includes a first preset sub-period and a second preset sub-period that have the same duration and are adjacent to each other, which means that the first preset sub-period and the second preset sub-period are both in the preset period, but the sum of the first preset sub-period and the second preset sub-period may not be the preset period. For example, if the preset period is 2.5 seconds, the first preset sub-period may be a period of 0.5 second to 1.5 seconds, and the second preset sub-period may be a period of 1.5 seconds to 2.5 seconds.

In some embodiments, the first preset sub-period may be a period after a third preset sub-period. The third preset sub-period here may be the same as the first preset sub-period, or may be different from the first preset sub-period. In this embodiment, the correlation of the second environmental noise information in the first preset sub-period and the second preset sub-period is calculated after it is detected that the first noise energy of the second environmental noise information is greater than the third preset sub-period of the energy threshold, that is, the correlation is calculated after the noise information tends to be stable, which can improve the accuracy of judgment and can reduce unstable noise information or unnecessary calculations caused by transient noise information.

Here, the correlation between the second environmental noise information of the first preset sub-period and the environmental noise information of the second preset sub-period may include: a difference between noise energy of the second environmental noise information of the first preset sub-period and noise energy of the environmental noise information of the second preset sub-period.

Of course, in order to be able to accurately determine the correlation, the step of calculating the correlation between the second environmental noise information of the first preset sub-period and the environmental noise information of the second preset sub-period may further include: calculating a coincidence between an energy distribution curve of the noise energy of the second environmental noise information of the first preset sub-period and an energy distribution curve of the noise energy of the environmental noise information of the second preset sub-period. In short, the more relevant the second environmental noise information of the first preset sub-period is to the environmental noise information of the second preset sub-period, the more stable the noise information is, that is, the greater the possibility that the second environmental noise information is the target noise information is.

In this embodiment, the correlation between the second environmental noise information of the first preset sub-period and the second environmental noise information of the second preset sub-period is determined, and it is determined that the second environmental noise information is the target noise information when the correlation is greater than or equal to the correlation threshold, which can improve the accuracy of determining whether the second environmental noise information is the target noise information.

In order to simplify the calculation, as another optional embodiment, the method further includes:

A second frequency band range of sound information of a specific scenario is determined when the second environmental noise information includes the sound information of the specific scenario;

The second environmental noise information is processed according to the second frequency band range of the sound information of the specific scenario to obtain third environmental noise information;

The step of determining a correlation between the second environmental noise information of the first preset sub-period and the second environmental noise information of the second preset sub-period may include:

A correlation between the third environmental noise information of the first preset sub-period and the third environmental noise information of the second preset sub-period is determined.

Here, the sound of the specific scenario may be, for example, a ring tone, sound of a speaker, etc. Since these sounds are not target noise information, the frequency bands of these sounds can be directly canceled, and only the second environmental noise information beyond the second frequency band range can be calculated, which can reduce the amount of calculation and improve the calculation efficiency. In addition, due to the strong instability of human speech, it has great interference to the comparison of noise energy in the preset period. Thus, the accuracy of correlation comparison of the second environmental noise in the first preset period and the second preset period can also be improved.

In order to further improve the accuracy of correlation comparison, as another optional embodiment, both the first preset sub-period and the second preset sub-period include: a preset number of frame periods;

The step of determining a correlation between the third environmental noise information of the first preset sub-period and the third environmental noise information of the second preset sub-period may include:

First noise sub-energy of each frame period in the third environmental noise information of the first preset sub-period is determined; an energy distribution of the first noise sub-energy of the third environmental noise information of the first preset sub-period is determined according to the first noise sub-energy of each frame period;

Second noise sub-energy of each frame period in the third environmental noise information of the second preset sub-period is determined; an energy distribution of the second noise sub-energy of the third environmental noise information of the second preset sub-period is determined according to the second noise sub-energy of each frame period;

The correlation between the third environmental noise information of the first preset sub-period and the third environmental noise information of the second preset sub-period is determined according to the energy distribution of the first noise sub-energy and the energy distribution of the second noise sub-energy.

Figure 4:
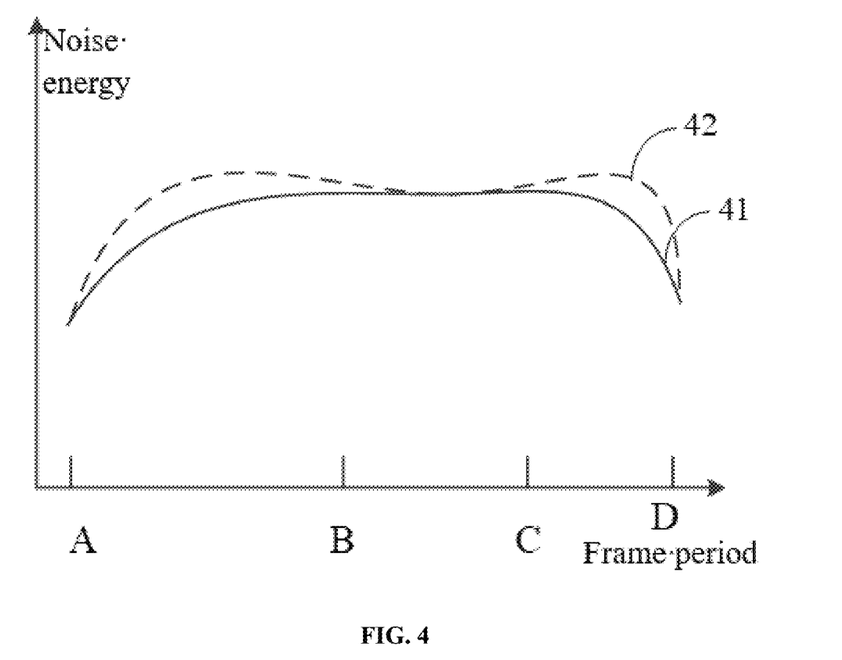
FIG. 4 shows an energy distribution curve of noise sub-energy of a third environmental noise according to an example of the present disclosure.

For example, referring to FIG. 4, the energy distribution curve 41 of the first noise sub-energy of each frame period in the third environmental noise information of the first preset sub-period and the energy distribution curve 42 of the second noise sub-energy of each frame period in the third environmental noise information of the second preset sub-period have a coincidence greater than a coincidence threshold, that is, the correlation between the third noise information of the first preset sub-period and the third environmental noise information of the second preset sub-period is greater than the correlation threshold.

Figure 5:
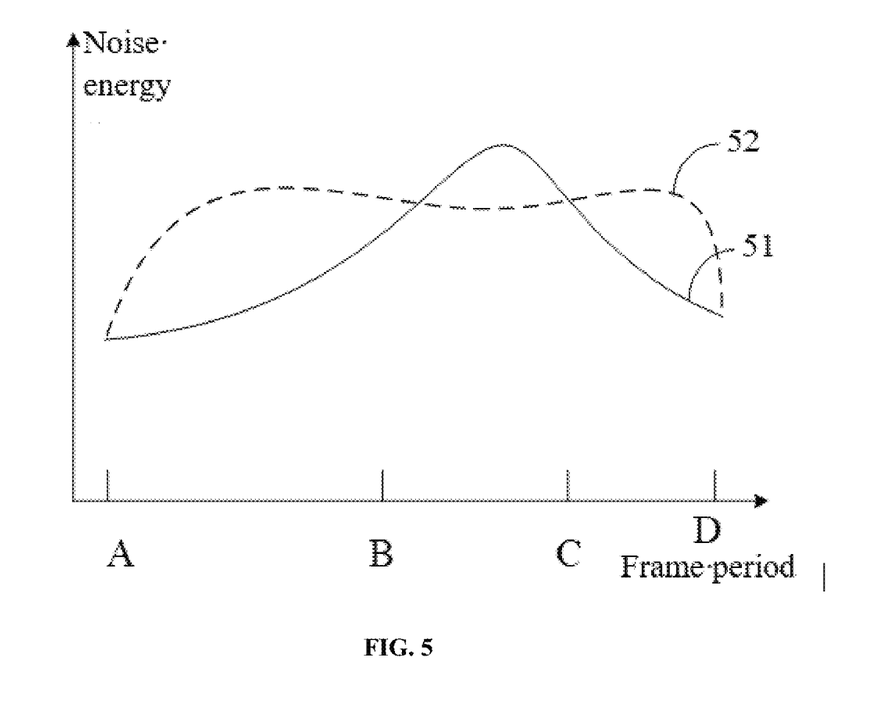
FIG. 5 shows another energy distribution curve of noise sub-energy of a third environmental noise according to an example of the present disclosure.

In other embodiments, referring to FIG. 5, the energy distribution curve 51 of the first noise sub-energy of each frame period in the third environmental noise information of the first preset sub-period and the energy distribution curve 52 of the second noise sub-energy of each frame period in the third environmental noise information of the second preset sub-period have a coincidence smaller than the coincidence threshold, that is, the correlation between the third environmental noise information of the first preset sub-period and the third environmental noise information of the second preset sub-period is smaller than the correlation threshold.

It should be supplemented that in some embodiments, noise energy of a predetermined number of frame periods is counted first, so as to draw the energy distribution curve. Here, the predetermined number is less than a preset number.

For example, still taking 4 frames of data as 1 segment data, the energy of the 1 segment data calculated is a composite of energy of the 4 frames of data. The composite of energy of the 4 frames of data is calculated by expression (4):

$$Seblock(a) = \sum_{i=1}^{4} Se(4a + i) \quad (4)$$

Where, a is an index of the segment data.

In order to be able to draw the energy curve more smoothly, a set number of segments may also be used to draw the energy distribution curve. For example, 10 segment data is used, and a composite of energy of the 10 segment data is calculated by expression (5):

$$Seblock10(a) = \frac{1}{10} * \sum_{i=a-9}^{a} Seblock(i), a \geq 10 \quad (5)$$

Based on this, a smoother energy distribution curve can be drawn, so that the coincidence of the correlation can be determined, and the correlation of the third environmental noise information in the first preset period and the second preset period can be accurately determined.

When the correlation is calculated, taking the first preset period of 0.5 s to 1.5 s and the second preset period of 1.5 s to 2.5 s as an example, the noise energy is stored at the beginning 0.5 s when the first noise energy is greater than the energy threshold. Each segment of Sblock(a) is spliced from 4 frames of sub-energy, and is calculated by expression (6).

$$Sblock(a) = \left[\{S(k, 4a+1)\}_{k=r}^{N-r} \{S(k, 4a+2)\}_{k=r}^{N-r} \{S(k, 4a+3)\}_{k=r}^{N-r} \{S(k, 4a+4)\}_{k=r}^{N-r}\right] \quad (6)$$

Here, r is 40, indicating that only the spectrum information in the frequency band of greater than 2400 Hz is used, which reduces the interference of residual echoes and sound of a specific scenario to the calculation of correlation, and reduces the amount of calculation.

Mean values of noise energy from 0.5 second to 1.5 seconds and 2.5 seconds are respectively determined according to expression (7).

$$Sblockmean(t) = \frac{1}{c} * \left(\sum_{a=1+t/0.032}^{c+t/0.032} Sblock(a)\right) \quad (7)$$

Here, the value of c is 31, so the mean value of the noise energy at is is approximately selected.

Here, when the correlation is calculated, the correlation between Sblockmean(0.5) and Sblockmean(1.5) can be calculated through a Pearson correlation coefficient.

In some embodiments, the correlation threshold may be 0.85. Of course, in other embodiments, the correlation threshold may also be other values. The value of the correlation threshold may be determined according to the type of noise corresponding to the noise scenario. It can be understood that different types of noise correspond to different stability of the noise, and the stability of the noise is positively correlated with a noise threshold. For example, in a home noise scenario, the correlation threshold may be 0.85.

In order to further improve the accuracy of determining the target noise information, as another optional embodiment, the method further includes:

Whether an energy ratio of the second noise sub-energy to the third noise sub-energy in each frame period satisfies a preset condition is determined when the correlation is greater than or equal to the correlation threshold;

It is determined that the environmental audio information represents the target noise scenario when the energy ratio of the second noise sub-energy to the third noise sub-energy in each frame period satisfies the preset condition, the preset condition being that the spectrum fluctuation represented by the energy ratio exceeds a preset fluctuation.

In some embodiments, the energy ratio of the second noise sub-energy to the third noise sub-energy in each frame period satisfying the preset condition may include: a mean value of the energy ratio of the second noise sub-energy to the third noise sub-energy in each frame period is determined; and if the mean value is greater than a mean value threshold, it is determined that the energy ratio of the second noise sub-energy to the third noise sub-energy in each frame period satisfies the preset condition.

In other embodiments, the energy ratio of the second noise sub-energy to the third noise sub-energy in each frame period satisfying the preset condition may include: a standard deviation of the energy ratio of the second noise sub-energy to the third noise sub-energy in each frame period is determined; and if the standard deviation is less than a standard deviation threshold, it is determined that the energy ratio of the second noise sub-energy to the third noise sub-energy in each frame period satisfies the preset condition.

It can be understood that if the mean value of the energy ratio of the second noise sub-energy to the third noise sub-energy in each frame period is greater than the mean value threshold, or the standard deviation of the second noise sub-energy and the third noise sub-energy in each frame period is less than the standard deviation threshold, it indicates that the spectrum information distribution of the second environmental noise is relatively uniform, the spectrum fluctuation is small, and the second environmental noise information can be identified as the target noise information.

In some embodiments, when the standard deviation of the energy ratio is less than 0.1 and the mean value of energy is greater than 0.012, it indicates that the target noise information is detected.

As such, whether the second environmental noise information is the target noise information is further determined through the mean value and standard deviation of the energy ratio of the second noise sub-energy to the third noise sub-energy in each frame period, which can improve the accuracy of determination.

As another optional embodiment, the method further includes:

It is determined that the environmental audio information does not represent the target noise scenario if the correlation is less than the correlation threshold.

As such, the mis-adjustment on the audio and video information parameters of the electronic equipment when the electronic equipment is not in the target noise scenario can be reduced.

Further, the disclosure further provides a specific embodiment to further understand the information processing method provided by the embodiment of the disclosure.

The method described in this embodiment is specifically applied to an electronic equipment, especially a smart television; and the audio module described in this embodiment includes a speaker of the smart television and a microphone of the smart television. The noise scenario in this embodiment is a home noise scenario as an example, such as home noise from a sweeping robot, a hair dryer, a range hood, or a juicer. When the user is watching a television program, if there is such noise, the volume of the television needs to be turned up.

Figure 6:
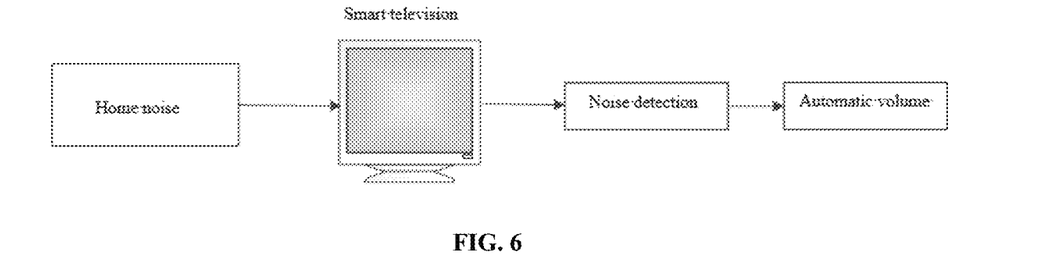
FIG. 6 is a schematic diagram of a scenario of automatic volume adjustment based on environmental noise in related technologies, according to an example of the present disclosure.

Refer to FIG. 6, which is a schematic diagram of a scenario of automatic volume adjustment based on environmental noise in related technologies. As shown in FIG. 6, when the microphone of the smart television collects home noise, noise detection is performed and the volume is adjusted based on the detection result of noise detection. In related technologies, the accuracy of noise detection is relatively low. Usually, only noise volume is judged, and the judgment cannot be combined with the scenario. For example, when the user makes a phone call, the noise volume will increase. If the volume is also turned up at this time, it obviously does not conform to the current scenario. In addition, the judgment on the noise scenario often requires the help of a relatively complex neural network algorithm and the like, which is obviously complex to implement.

Based on this, how to implement an automatic volume adjustment improvement with higher accuracy and simple calculation has become a technical shortcoming that needs to be improved.

Figure 7:
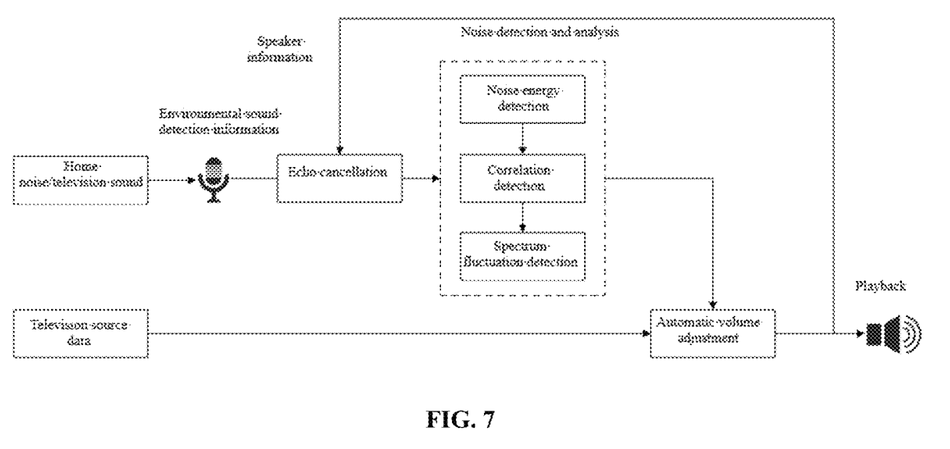
FIG. 7 is a schematic diagram of a scenario of automatic volume adjustment based on environmental noise according to an example of the present disclosure.

Refer to FIG. 7, which is a schematic diagram of a scenario of automatic volume adjustment based on environmental noise according to a specific embodiment. As shown in FIG. 7, in this embodiment, noise detection and analysis are optimized. For example, when echo cancellation is performed using environmental sound detection information and speaker information, in the presence of residual echo information, the first frequency band range of the residual echo information will be removed in the step of noise energy detection, and environmental noise information beyond the first frequency band range, that is, the second environmental noise information described in the above embodiment, is calculated. As such, not only the amount of calculation can be reduced, but also the residual echo information can be removed to improve the accuracy of an analysis object for noise analysis.

During the correlation detection, not only the second frequency band range of the sound of the specific scenario is removed, but also the correlation is smoothly compared frame by frame or segment by segment, that is, compared through the coincidence of curves of the energy distribution of the first noise sub-energy of the third environmental noise information of the first preset sub-period and the energy distribution of the second noise sub-energy of the third environmental noise information of the second preset sub-period, which can improve the accuracy of correlation comparison and then improve the accuracy of noise analysis.

After the correlation is greater than the correlation threshold, spectrum fluctuation detection is performed, that is, only the mean value of the energy ratio of the second noise sub-energy to the third noise sub-energy in each frame period is greater than the mean value threshold, and the standard deviation of the energy ratio of the second noise sub-energy to the third noise sub-energy in each frame period is less than the standard deviation threshold, it is determined that the second environmental noise information is the target noise information. That is, only when the spectrum fluctuation of the third environmental noise information is relatively small, that is, the noise is relatively stable, the noise can be determined as home noise, such as continuous and stable noise from a hair dryer.

As such, after the noise energy detection, correlation detection and spectrum fluctuation detection, it is determined whether the environmental noise is target noise, which obviously can improve the accuracy of target noise detection. In addition, since the first frequency band of the residual echo information is removed during the noise energy detection, and the second frequency band of the sound of the specific scenario is removed during the correlation detection, the amount of calculation can also be reduced.

In the above embodiment, the accuracy of target noise detection is ensured with relatively low computational complexity, the improvement of automatic volume adjustment based on environmental noise in related technologies is optimized, and the auditory experience of the electronic equipment is improved.

Figure 8:
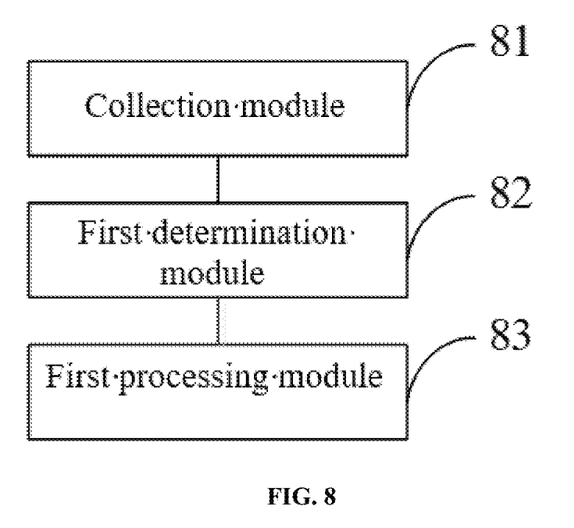
FIG. 8 is a block diagram of an information processing apparatus according to an example of the present disclosure.

FIG. 8 is a block diagram of an information processing apparatus according to some embodiments. Referring to FIG. 8, the apparatus includes:

a collection module 81, configured to collect environmental audio information when the electronic equipment plays audio and video information;

a first determination module 82, configured to perform noise detection on the environmental audio information to determine whether the environmental audio information represents a target noise scenario; and a first processing module 83, configured to process a parameter of the audio and video information played by the electronic equipment when the environmental audio information represents the target noise scenario.

In some optional embodiments, the first determination module 82 further includes:

a first determination submodule, configured to determine first environmental noise information according to the environmental audio information;

a second determination submodule, configured to determine a first frequency band range corresponding to residual echo information when the first environmental noise information includes the residual echo information;

a processing submodule, configured to process the first environmental noise information according to the first frequency band range of the residual echo information to obtain second environmental noise information; and a third determination submodule, configured to determine whether the environmental audio information represents the target noise scenario according to the second environmental noise information.

In some optional embodiments, the third determination submodule is further configured to:

determine first noise energy of the second environmental noise information according to the second environmental noise information; and determine that the environmental audio information represents the target noise scenario when the first noise energy is greater than an energy threshold, and the duration of the first noise energy greater than the energy threshold exceeds a preset period.

In some optional embodiments, the preset period includes: a first preset sub-period and a second preset sub-period that have the same duration and are adjacent;

The third determination submodule is further configured to:

determine a correlation between the second environmental noise information of the first preset sub-period and the second environmental noise information of the second preset sub-period when the first noise energy is greater than the energy threshold, and the duration of the first noise energy greater than the energy threshold exceeds the preset period; and determine that the environmental audio information represents the target noise scenario when the correlation is greater than or equal to a correlation threshold.

In some optional embodiments, the apparatus further includes:

a second determination module, configured to determine a second frequency band range of sound information of a specific scenario when the second environmental noise information includes the sound information of the specific scenario; and a second processing module, configured to process the second environmental noise information according to the second frequency band range of the sound information of the specific scenario to obtain third environmental noise information;

The third determination submodule is further configured to:

determine a correlation between the third environmental noise information of the first preset sub-period and the third environmental noise information of the second preset sub-period.

In some optional embodiments, both the first preset sub-period and the second preset sub-period include: a preset number of frame periods;

The third determination submodule is specifically configured to:

determine first noise sub-energy of each frame period in the third environmental noise information of the first preset sub-period; determine an energy distribution of the first noise sub-energy of the third environmental noise information of the first preset sub-period according to the first noise sub-energy of each frame period;

determine second noise sub-energy of each frame period in the third environmental noise information of the second preset sub-period; determine an energy distribution of the second noise sub-energy of the third environmental noise information of the second preset sub-period according to the second noise sub-energy of each frame period; and determine the correlation between the third environmental noise information of the first preset sub-period and the third environmental noise information of the second preset sub-period according to the energy distribution of the first noise sub-energy and the energy distribution of the second noise sub-energy.

In some optional embodiments, the apparatus further includes:

a third determination module, configured to determine third noise sub-energy of each frame period in the second noise energy of the first environmental noise information of the second preset sub-period;

The third determination submodule is further specifically configured to:

determine whether an energy ratio of the second noise sub-energy to the third noise sub-energy in each frame period satisfies a preset condition when the correlation is greater than or equal to the correlation threshold; and determine that the environmental audio information represents the target noise scenario when the energy ratio of the second noise sub-energy to the third noise sub-energy in each frame period satisfies the preset condition, the preset condition being that the spectrum fluctuation represented by the energy ratio exceeds a preset fluctuation.

In some optional embodiments, the electronic equipment includes a plurality of speakers;

The first determination submodule is further configured to:

perform echo cancellation on the environmental audio information according to the environmental audio information collected by the plurality of speakers to determine the first environmental noise information.

With regard to the apparatus in the above embodiment, the specific manners that the respective modules perform the operations have been described in detail in the embodiment relating to the method, and will not be explained in detail herein.

Figure 9:
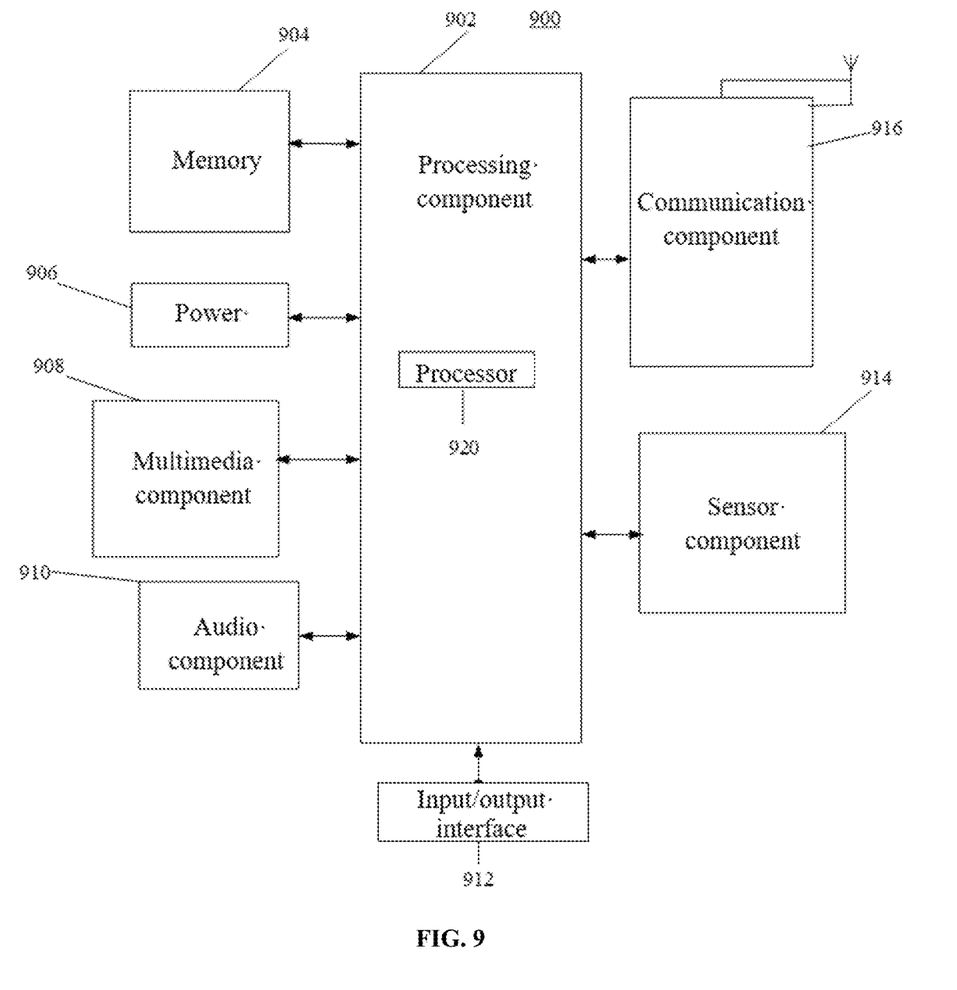
FIG. 9 is a block diagram of an electronic equipment according to an example of the present disclosure.

FIG. 9 is a block diagram of an electronic equipment 900 according to some embodiments. For example, the electronic equipment 900 may be a mobile phone, a computer, a digital broadcasting electronic equipment, a messaging device, a game console, a tablet device, a medical device, a fitness device, a personal digital assistant, etc.

Referring to FIG. 9, the electronic equipment 900 may include one or more of the following components: a processing component 902, a memory 904, a power component 906, a multimedia component 908, an audio component 910, an input/output (I/O) interface 912, a sensor component 914, and a communication component 916.

The processing component 902 usually controls the overall operations of the electronic equipment 900, such as operations associated with display, telephone call, data communication, camera operation and recording operation. The processing component 902 may include one or more processors 920 to execute instructions to complete all of or part of the steps of the above method. Moreover, the processing component 902 may include one or more modules to facilitate interaction between the processing component 902 and other components. For example, the processing component 902 may include a multimedia module to facilitate interaction between the multimedia component 908 and the processing component 902.

The memory 904 is configured to store various types of data to support operations at the electronic equipment 900. These data include instructions, contact data, phone book data, messages, pictures, videos, etc. for any application or method operated on the electronic equipment 900. The memory 904 may be implemented by any type of volatile or non-volatile storage device or a combination thereof, such as a static random access memory (SRAM), an electrically erasable programmable read-only memory (EEPROM), an erasable. programmable read-only memory (EPROM), a programmable read-only memory (PROM), a read-only memory (ROM), a magnetic memory, a flash memory, a magnetic disk or an optical disk.

The power component 906 supplies power to various components of the electronic equipment 900. The power component 906 may include a power management system, one or more power sources, and other components associated with power generation, management and distribution of the electronic equipment 900.

The multimedia component 908 includes a screen for providing an output interface between the electronic equipment 900 and the user. In some embodiments, the screen may include a liquid crystal display (LCD) and a touch panel (TP). If the screen includes a touch panel, the screen may be implemented as a touch screen to receive input signals from the user. The touch panel includes one or more touch sensors to sense touches, slides and gestures on the touch panel. The touch sensor may sense not only the boundary of the touch or slide, but also the duration and pressure associated with the touch or slide. In some embodiments, the multimedia component 908 includes a front camera and/or a rear camera. When the electronic equipment 900 is in an operation mode, such as a shooting mode or a video mode, the front camera and/or the rear camera may receive external multimedia data. Each front or rear camera may be a fixed optical lens system or have focal length and optical zoom capability.

The audio component 910 is configured to output and/or input audio signals. For example, the audio component 910 includes a microphone (MIC), which is configured to receive external audio signals when the electronic equipment 900 is in an operation mode, such as a call mode, a recording mode and a voice recognition mode. The received audio signals may be further stored in the memory 904 or sent by the communication component 916. In some embodiments, the audio component 910 further includes a speaker for outputting audio signals.

The I/O interface 912 provides an interface between the processing component 902 and a peripheral interface module which may be a keyboard, a click wheel, a button, etc. The button may include but is not limited to a home button, a volume button, a start button and a lock button.

The sensor component 914 includes one or more sensors for providing various aspects of state evaluation for the electronic equipment 900. For example, the sensor component 914 may detect the on/off state of the electronic equipment 900, and relative positions of components such as a display and a keypad of the electronic equipment 900. The sensor component 914 may also detect a position change of the electronic equipment 900 or one component of the electronic equipment 900, presence or absence of contact between the user and the electronic equipment 900, an orientation or acceleration/deceleration of the electronic equipment 900 and a temperature change of the electronic equipment 900. The sensor component 914 may include a proximity sensor configured to detect the presence of nearby objects without any physical contact. The sensor component 914 may also include an optical sensor, such as a CMOS or CCD image sensor, for use in imaging applications. In some embodiments, the sensor component 914 may also include an acceleration sensor, a gyro sensor, a magnetic sensor, a pressure sensor, or a temperature sensor.

The communication component 916 is configured to facilitate wired or wireless communication between the electronic equipment 900 and other devices. The electronic equipment 900 may access a wireless network based on communication standards, such as WiFi, 2G or 3G, or a combination thereof. In one or more embodiments, the communication component 916 receives broadcast signals or broadcast related information from an external broadcast management system via a broadcast channel. In one or more embodiments, the communication component 916 further includes a near field communication (NFC) module to facilitate short-range communication. For example, the NFC module may be implemented based on radio frequency identification (RFID) technology, infrared data association (IrDA) technology, ultra wide band (UWB) technology, Bluetooth (BT) technology, and other technologies.

In some embodiments, the electronic equipment 900 may be implemented by one or more application specific integrated circuits (ASICs), digital signal processors (DSPs), digital signal processing devices (DSPDs), programmable logic devices (PLDs), field programmable gate arrays (FPGAs), controllers, microcontrollers, microprocessors or other electronic components to perform the above method.

In some embodiments, a non-temporary computer readable storage medium including instructions is further provided, such as a memory 904 including instructions executable by the processor 920 of the electronic equipment 900 to complete the above method. For example, the non-temporary computer readable storage medium may be an ROM, a random access memory (RAM), a CD-ROM, a magnetic tape, a floppy disk, an optical data storage device, etc.

A non-temporary computer readable storage medium stores instructions that, when executed by a processor of an electronic equipment, enable the electronic equipment to perform the information processing method of the abovementioned embodiments.

A person skilled in the art would readily conceive of other embodiments of the disclosure after considering the specification and practicing the present disclosure. The present application is intended to cover any variations, uses or adaptive changes of the disclosure. These variations, uses or adaptive changes follow the general principle of the disclosure and include common general knowledge or conventional technical means in the technical field that are not disclosed in the disclosure. The specification and the embodiments are merely regarded as examples, and the real scope and spirit of the disclosure are pointed out by the following claims.

It should be understood that the disclosure is not limited to the precise structure described above and shown in the drawings, and various modifications and changes can be made without departing from its scope. The scope of the disclosure is only limited by the appended claims.

What is claimed is:
1. A method for information processing, applied to an electronic equipment, comprising:
  collecting environmental audio information when the electronic equipment plays multimedia;
  performing noise detection on the environmental audio information to determine whether the environmental audio information represents a target noise scenario; and
  processing a parameter of the multimedia played by the electronic equipment when the environmental audio information represents the target noise scenario;
  wherein performing noise detection on the environmental audio information to determine whether the environmental audio information represents the target noise scenario comprises:
  determining first environmental noise information according to the environmental audio information;

determining a first frequency band range corresponding to residual echo information when the first environmental noise information comprises the residual echo information;

processing the first environmental noise information according to the first frequency band range of the residual echo information to obtain second environmental noise information; and determining whether the environmental audio information represents the target noise scenario according to the second environmental noise information.

2. The method according to claim 1, wherein determining whether the environmental audio information represents the target noise scenario according to the second environmental noise information comprises:

determining first noise energy of the second environmental noise information according to the second environmental noise information; and determining that the environmental audio information represents the target noise scenario when the first noise energy is greater than an energy threshold, and a duration of the first noise energy greater than the energy threshold exceeds a preset period.

3. The method according to claim 2, wherein the preset period comprises a first preset sub-period and a second preset sub-period that have a same duration and are adjacent to each other, and wherein determining that the environmental audio information represents the target noise scenario when the first noise energy is greater than the energy threshold, and the duration of the first noise energy greater than the energy threshold exceeds the preset period comprises:

determining a correlation between the second environmental noise information of the first preset sub-period and the second environmental noise information of the second preset sub-period when the first noise energy is greater than the energy threshold, and the duration of the first noise energy greater than the energy threshold exceeds the preset period; and determining that the environmental audio information represents the target noise scenario when the correlation is greater than or equal to a correlation threshold.

4. The method according to claim 3, further comprising:

determining a second frequency band range of sound information of a specific scenario when the second environmental noise information comprises the sound information of the specific scenario; and processing the second environmental noise information according to the second frequency band range of the sound information of the specific scenario to obtain third environmental noise information;

wherein determining the correlation between the second environmental noise information of the first preset sub-period and the second environmental noise information of the second preset sub-period comprises:

determining a correlation between the third environmental noise information of the first preset sub-period and the third environmental noise information of the second preset sub-period.

5. The method according to claim 4, wherein both the first preset sub-period and the second preset sub-period comprise a preset number of frame periods, and wherein determining the correlation between the third environmental noise information of the first preset sub-period and the third environmental noise information of the second preset sub-period comprises:

determining first noise sub-energy of each frame period in the third environmental noise information of the first preset sub-period;

determining an energy distribution of the first noise sub-energy of the third environmental noise information of the first preset sub-period according to the first noise sub-energy of each frame period;

determining second noise sub-energy of each frame period in the third environmental noise information of the second preset sub-period;

determining an energy distribution of the second noise sub-energy of the third environmental noise information of the second preset sub-period according to the second noise sub-energy of each frame period; and determining the correlation between the third environmental noise information of the first preset sub-period and the third environmental noise information of the second preset sub-period according to the energy distribution of the first noise sub-energy and the energy distribution of the second noise sub-energy.

6. The method according to claim 5, further comprising:

determining third noise sub-energy of each frame period in the second noise energy of the first environmental noise information of the second preset sub-period;

wherein determining that the environmental audio information represents the target noise scenario when the correlation is greater than or equal to the correlation threshold comprises:

determining whether an energy ratio of the second noise sub-energy to the third noise sub-energy in each frame period satisfies a preset condition when the correlation is greater than or equal to the correlation threshold; and determining that the environmental audio information represents the target noise scenario when the energy ratio of the second noise sub-energy to the third noise sub-energy in each frame period satisfies the preset condition, wherein the preset condition is that spectrum fluctuation represented by the energy ratio exceeds a preset fluctuation.

7. The method according to claim 1, wherein the electronic equipment comprises a plurality of speakers and a microphone, and wherein determining first environmental noise information according to the environmental audio information comprises:

performing echo cancellation on the environmental audio information according to the environmental audio information collected by the microphone to determine the first environmental noise information.

8. An electronic equipment, comprising:

one or more processors; and a non-transitory computer-readable storage medium storing instructions executable by the one or more processors, wherein the one or more processors are configured to:

collect environmental audio information when the electronic equipment plays multimedia;

perform noise detection on the environmental audio information to determine whether the environmental audio information represents a target noise scenario; and process a parameter of the multimedia played by the electronic equipment when the environmental audio information represents the target noise scenario;

perform noise detection on the environmental audio information to determine whether the environmental audio information represents the target noise scenario comprises:

determine first environmental noise information according to the environmental audio information;
demine a first frequency band range corresponding to residual echo information when the first environmental noise information comprises the residual echo information;
process the first environmental noise information according to the first frequency band range of the residual echo information to obtain second environmental noise information; and
determine whether the environmental audio information represents the target noise scenario according to the second environmental noise information.

9. The electronic equipment according to claim 8, wherein the one or more processors configured to determine whether the environmental audio information represents the target noise scenario are further configured to:
determine first noise energy of the second environmental noise information according to the second environmental noise information; and
determine that the environmental audio information represents the target noise scenario when the first noise energy is greater than an energy threshold, and a duration of the first noise energy greater than the energy threshold exceeds a preset period.

10. The electronic equipment according to claim 9, wherein the one or more processors configured to determine whether the environmental audio information represents the target noise scenario are further configured to:
determine a correlation between the second environmental noise information of a first preset sub-period and the second environmental noise information of a second preset sub-period when the first noise energy is greater than the energy threshold, and the duration of the first noise energy greater than the energy threshold exceeds the preset period, wherein the first preset sub-period and the second preset sub-period are two periods that have the same duration and are adjacent to each other in the preset period; and
determine that the environmental audio information represents the target noise scenario when the correlation is greater than or equal to a correlation threshold.

11. The electronic equipment according to claim 10, wherein the one or more processors are further configured to:
determine a second frequency band range of sound information of a specific scenario when the second environmental noise information comprises the sound information of the specific scenario;
process the second environmental noise information according to the second frequency band range of the sound information of the specific scenario to obtain third environmental noise information; and
determine a correlation between the third environmental noise information of the first preset sub-period and the third environmental noise information of the second preset sub-period.

12. The electronic equipment according to claim 11, wherein the one or more processors configured to determine the correlation between the third environmental noise information of the first preset sub-period and the third environmental noise information of the second preset sub-period are further configured to:
determine first noise sub-energy of each frame period in the third environmental noise information of the first preset sub-period; determining an energy distribution of the first noise sub-energy of the third environmental noise information of the first preset sub-period according to the first noise sub-energy of each frame period;
determine second noise sub-energy of each frame period in the third environmental noise information of the second preset sub-period; determining an energy distribution of the second noise sub-energy of the third environmental noise information of the second preset sub-period according to the second noise sub-energy of each frame period; and
determine the correlation between the third environmental noise information of the first preset sub-period and the third environmental noise information of the second preset sub-period according to the energy distribution of the first noise sub-energy and the energy distribution of the second noise sub-energy.

13. The electronic equipment according to claim 12, wherein the one or more processors are further configured to:
determine third noise sub-energy of each frame period in the second noise energy of the first environmental noise information of the second preset sub-period;
determine whether an energy ratio of the second noise sub-energy to the third noise sub-energy in each frame period satisfies a preset condition when the correlation is greater than or equal to the correlation threshold; and
determine that the environmental audio information represents the target noise scenario when the energy ratio of the second noise sub-energy to the third noise sub-energy in each frame period satisfies the preset condition, wherein the preset condition is that spectrum fluctuation represented by the energy ratio exceeds a preset fluctuation.

14. The electronic equipment according to claim 8, wherein the one or more processors configured to determine the first environmental noise information are further configured to:
perform echo cancellation on the environmental audio information according to the environmental audio information collected by a microphone of the electronic equipment to determine the first environmental noise information.

15. A non-transitory computer-readable storage medium storing a plurality of programs for execution by an electronic equipment having one or more processors, wherein the plurality of programs, when executed by the one or more processors, cause the electronic equipment to perform acts comprising:
collecting environmental audio information when the electronic equipment plays multimedia;
performing noise detection on the environmental audio information to determine whether the environmental audio information represents a target noise scenario;
processing a parameter of the multimedia played by the electronic equipment when the environmental audio information represents the target noise scenario;
wherein performing noise detection on the environmental audio information to determine whether the environmental audio information represents the target noise scenario comprises:
determining first environmental noise information according to the environmental audio information;
determining a first frequency band range corresponding to residual echo information when the first environmental noise information comprises the residual echo information;
processing the first environmental noise information according to the first frequency band range of the residual echo information to obtain second environmental noise information; and determining whether the environmental audio information represents the target noise scenario according to the second environmental noise information.

* * * * *